(12) United States Patent
Shimokawa et al.

(10) Patent No.: US 10,247,630 B2
(45) Date of Patent: Apr. 2, 2019

(54) SEMICONDUCTOR DEVICE, MECHANICAL QUANTITY MEASURING DEVICE, AND SEMICONDUCTOR DEVICE FABRICATING METHOD

(71) Applicant: HITACHI AUTOMOTIVE SYSTEMS, LTD., Ibaraki (JP)

(72) Inventors: Hanae Shimokawa, Tokyo (JP); Shosaku Ishihara, Tokyo (JP); Atsuo Soma, Hitachinaka (JP); Junji Onozuka, Hitachinaka (JP); Hiroshi Onuki, Hitachinaka (JP); Daisuke Terada, Hitachinaka (JP); Mizuki Shibata, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/742,809

(22) PCT Filed: Jun. 30, 2016

(86) PCT No.: PCT/JP2016/069521
§ 371 (c)(1),
(2) Date: Jan. 8, 2018

(87) PCT Pub. No.: WO2017/006840
PCT Pub. Date: Jan. 12, 2017

(65) Prior Publication Data
US 2018/0202883 A1      Jul. 19, 2018

(30) Foreign Application Priority Data

Jul. 7, 2015   (JP) ................................. 2015-135899

(51) Int. Cl.
*H01C 8/02*      (2006.01)
*G01L 9/00*      (2006.01)
(Continued)

(52) U.S. Cl.
CPC .............. *G01L 9/0055* (2013.01); *G01B 7/16* (2013.01); *G01B 7/18* (2013.01); *G01L 9/00* (2013.01);
(Continued)

(58) Field of Classification Search
CPC ......... H01L 24/29; H01L 24/83; H01L 29/84; H01L 2224/29019; G01L 9/00
See application file for complete search history.

(56) References Cited

U.S. PATENT DOCUMENTS

| 4,840,067 A | 6/1989 | Nishida et al. |
| 4,986,861 A | 1/1991 | Nishida et al. |

(Continued)

FOREIGN PATENT DOCUMENTS

| JP | 07-011461 B2 | 2/1995 |
| JP | 2013-036935 A | 2/2013 |
| JP | 2013-234955 A | 11/2013 |

OTHER PUBLICATIONS

International Search Report dated Jul. 26, 2016 for the International Application No. PCT/JP2016/069521.

*Primary Examiner* — Selim U Ahmed
*Assistant Examiner* — Andre Stevenson
(74) *Attorney, Agent, or Firm* — Volpe and Koenig, P.C.

(57) ABSTRACT

A semiconductor device includes a metal body; a bonding layer placed on the metal body; and a semiconductor chip placed on the bonding layer. The bonding layer includes a filler-containing first layer formed between the metal body and the semiconductor chip and a second layer bonded to the first layer and the semiconductor chip. The second layer has a thermal expansion coefficient higher than that of the first layer.

18 Claims, 8 Drawing Sheets (51) Int. Cl.
*G01B 7/16* (2006.01)
*H01L 29/84* (2006.01)
*H01L 23/00* (2006.01)

(52) U.S. Cl.
CPC .............. *H01L 24/29* (2013.01); *H01L 24/83* (2013.01); *H01L 29/84* (2013.01); *H01L 2224/29019* (2013.01); *H01L 2224/2957* (2013.01); *H01L 2224/29288* (2013.01); *H01L 2224/29387* (2013.01); *H01L 2224/29552* (2013.01); *H01L 2224/29575* (2013.01); *H01L 2224/29688* (2013.01); *H01L 2224/8389* (2013.01); *H01L 2224/83192* (2013.01)

(56) References Cited

U.S. PATENT DOCUMENTS 9,671,362 B2 * 6/2017 Horkheimer ........ B32B 37/1292
2016/0313199 A1 * 10/2016 Kazama ................ G01L 9/0044

* cited by examiner

| | METAL PLATE | | UNDERCOAT LAYER | | FIRST GLASS LAYER | | SECOND GLASS LAYER | | Si SEMICONDUCTOR CHIP | BONDABILITY |
|---|---|---|---|---|---|---|---|---|---|---|
| | MATERIAL | THERMAL EXPANSION COEFFICIENT (ppm/°C) | MATERIAL | THERMAL EXPANSION COEFFICIENT (ppm/°C) | MATERIAL | THERMAL EXPANSION COEFFICIENT (ppm/°C) | MATERIAL | THERMAL EXPANSION COEFFICIENT (ppm/°C) | THERMAL EXPANSION COEFFICIENT (ppm/°C) | |
| 1 | SUS 420 | 12 | NONE | - | GLASS | 5 | GLASS | 8 | 3 | ○ |
| 2 | SUS 630 | 12 | NONE | - | GLASS | 5 | GLASS | 7 | 3 | ○ |
| 3 | SUS 630 | 12 | NONE | - | GLASS | 4.5 | GLASS | 6 | 3 | ○ |
| 4 | SUS 630 | 12 | GLASS | 7 | GLASS | 4.5 | GLASS | 8 | 3 | ○ |
| 5 | SUS 630 | 12 | GLASS | 7 | GLASS | 4.5 | GLASS | 7 | 3 | ○ |
| 6 | SUS 630 | 12 | GLASS | 7 | GLASS | 4.5 | GLASS | 6 | 3 | ○ |
| 7 | SUS 630 | 12 | GLASS | 7 | GLASS | 4.5 | GLASS | 5.5 | 3 | ○ |
| 8 | SUS 420 | 12 | METAL LAYER OF W OR Mo | 5 | GLASS | 4.5 | GLASS | 8 | 3 | ○ |

SEMICONDUCTOR DEVICE, MECHANICAL QUANTITY MEASURING DEVICE, AND SEMICONDUCTOR DEVICE FABRICATING METHOD

TECHNICAL FIELD

The present invention relates to semiconductor devices, mechanical quantity measuring devices, and semiconductor device fabricating methods.

BACKGROUND ART

Some semiconductor devices are designed to detect deformation of a strain-causing body, such as a diaphragm, by bonding a semiconductor chip having sensor functions to the strain-causing body. Strain-causing bodies are often formed of metal such as stainless steel (SUS). In such a semiconductor device, the semiconductor chip may be detached or destroyed due to the differences in thermal expansion coefficient between the strain-causing body and a bonding agent and between the semiconductor chip and the bonding agent. For this reason, a known pressure sensor uses a bonding agent whose thermal expansion coefficient changes in a continuous manner from the side of semiconductor chip to the side of the strain-causing body. The thermal expansion coefficient of the bonding agent is adjusted by changing the amount of a silica filler added to its main component, or glass (see, for example, Patent Document 1).

PRIOR ART DOCUMENT

Patent Document

Patent Document 1: JP-2013-36935-A

SUMMARY OF THE INVENTION

Problem to be Solved by the Invention

In the structure of Patent Document 1, the thermal expansion coefficient of the bonding agent is, on the semiconductor chip side, close to that of the semiconductor chip and, on the strain-causing body side, close to that of the strain-causing body. To achieve a thermal expansion coefficient close to that of the semiconductor chip, the mixing amount of the silica filler is increased. However, when the silica filler protrudes from the bonding agent, the reliability of bonding between the bonding agent and the semiconductor chip is impaired.

Means for Solving the Problem

According to a first aspect of the invention, a semiconductor device includes: a metal body; a bonding layer placed on the metal body; and a semiconductor chip placed on the bonding layer. The bonding layer includes a filler-containing first layer formed between the metal body and the semiconductor chip and a second layer bonded to the first layer and the semiconductor chip, the second layer having a thermal expansion coefficient higher than that of the first layer.

According to a second aspect of the invention, a mechanical quantity measuring device includes the above semiconductor device, and the semiconductor chip includes a strain detector.

According to a third aspect of the invention, a method for fabricating a semiconductor device includes: forming a filler-containing first bonding layer on a metal body; forming a second bonding layer on the first bonding layer, the second layer having a thermal expansion coefficient higher than that of the first bonding layer; and bonding a semiconductor chip to the second bonding layer.

Effect of the Invention

In accordance with the invention, the reliability of the bonding between the bonding layer and the semiconductor chip can be enhanced.

BRIEF DESCRIPTION OF DRAWINGS

FIGS. 3(*a*) to 3(*d*) are cross sections illustrating the method of fabricating the semiconductor device of FIG. 1.

MODES FOR CARRYING OUT THE INVENTION

Embodiment 1 of the Semiconductor Device

Embodiment 1 of the semiconductor device of the present invention will now be described with reference to the accompanying drawings.

Figure 1:
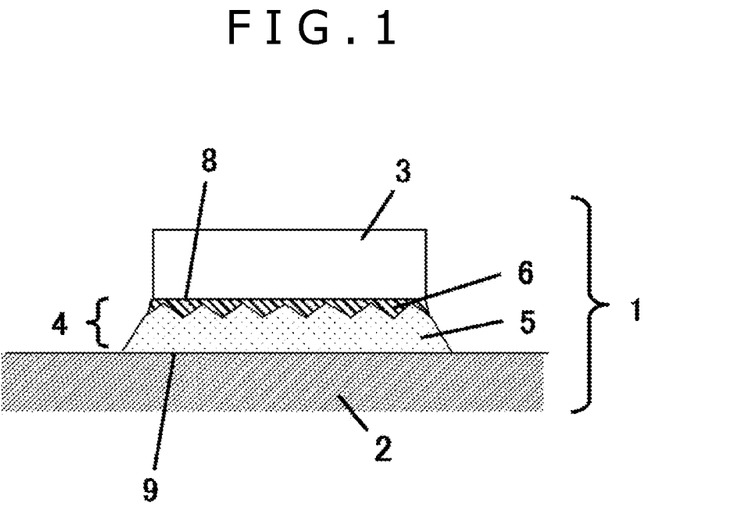
FIG. 1 is a cross section of Embodiment 1 of the semiconductor device of the invention.

FIG. 1 is a cross section illustrating Embodiment 1 of the semiconductor device of the invention.

The semiconductor device 1 includes a metal body 2, a semiconductor chip 3, and a bonding layer 4 that bonds the metal body 2 and the semiconductor chip 3.

The bonding layer 4 includes a first layer 5 formed on the metal body 2 and bonded to a front surface 9 of the metal body 2 and a second layer 6 placed between the first layer 5 and the semiconductor chip 3 and bonded to a rear surface 8 of the semiconductor chip 3. The metal body 2 is formed of iron, SUS, or the like. The semiconductor chip 3 is an integrated circuit element obtained by dicing a semiconductor wafer. The semiconductor chip 3 can have a built-in sensor element.

The thermal expansion coefficients of the respective components of the semiconductor device 1 are such that the metal body 2>the second layer 6>the first layer 5>the semiconductor chip 3.

A feature of the invention is that the thermal expansion coefficient of the second layer 6 bonded to the semiconductor chip 3 is higher than that of the first layer 5 bonded to the metal body 2. As will be described below, this improves the reliability of bonding between the semiconductor chip 3 and the bonding layer 4.

The following is an example of materials for the components of the semiconductor device 1 to achieve the above order of thermal expansion coefficients.

The metal body 2 is formed of iron, SUS, or the like. SUS420, for example, has a thermal expansion coefficient of about 12 ppm/° C. The silicon that forms the semiconductor chip 3 has a thermal expansion coefficient of about 3 ppm/° C.

The first layer 5 and second layer 6 of the bonding layer 4 are each formed of a glass material to which a filler with a thermal expansion coefficient lower than that of the glass is added. When the metal body 2 with the above thermal expansion coefficient is used, each of the first layer 5 and the second layer 6 of the bonding layer 4 has a thermal expansion coefficient of 3 to 12 ppm/° C. Note that the thermal expansion coefficient of the second layer 6 is larger than that of the first layer 5.

The thermal expansion coefficient of the glass material becomes smaller as the amount of a filler, whose thermal expansion coefficient being lower than that of the glass, contained in the glass gets larger. Thus, if the glass of the first layer 5 and the glass of the second layer 6 have the same thermal expansion coefficient, by the thermal expansion coefficient of the second layer 6 being higher than that of the first layer 5, it is meant that the amount of the filler contained in the second layer 6 is smaller than that contained in the first layer 5.

In a structure in which the metal body 2 and the semiconductor chip 3 are bonded with a bonding agent, the following, besides thermal expansion coefficients, are important:

first, the calcination temperature of the bonding agent; and second, the meltability and bondability of the bonding layer 4 with respect to the metal body 2 and the semiconductor chip 3.

Successively, these were examined.

The heatproof temperature of the semiconductor chip 3 is about 450° C. Thus, the calcination temperatures of the glass materials, or bonding agents, are preferably equal to or lower than 400° C. Low-melting-point glass materials currently available include, as their main components, oxides of Pb, Bi, V, Sn, Zn, Te, P, B, or their oxides. With these low-melting point glass materials, however, it is difficult to achieve the above calcination temperature. Also, the thermal expansion coefficient of a glass material itself is generally large; thus, the glass material is likely to detach especially from the semiconductor chip 3 due to the difference in thermal expansion coefficient.

For this reason, fillers with low thermal expansion coefficients are, as stated above, added to the glass materials to obtain bonding agents with the desired thermal expansion coefficients. As the fillers, it is possible to use cordierite formed of oxides of Mg and Al (its thermal expansion coefficient being about 1.7 to 2 ppm/° C.) or an oxide of Si (its thermal expansion coefficient being about 0.5 ppm/° C.). By adding such a filler to a glass material that has, as its main component, a compound of oxides of V and Te and is to be calcined at about 400° or lower, we evaluated the meltability of the glass material and its bondability with respect to the semiconductor chip 3 and the metal body 2.

Glass powder was put into a mold and pressed to form disk-shaped compacted powders having a diameter of about 3 mm. These compacted powders were heated on the metal body 2, and we observed how they melted.

After melting, the compacted glass powder without the filler turned into a dome shape without corners on its top and side surfaces, and the surfaces were smooth and lustrous. In other words, the glass material without the filler was good in terms of meltability.

On the other hand, the compacted powder to which the filler was added remained almost disk-shaped having corners as before the melting. Its surfaces were not lustrous, and its contact angles with respect to the metal body 2 were large. In other words, the glass material with the filler had poor meltability.

We further bonded the metal body 2 and the semiconductor chip 3 using the glass materials with and without the filler to examine and compare the bondability of the two materials.

In the case of the glass material without the filler, the semiconductor chip 3 detached from and was unable to be bonded to the metal body 2. When we examined the rear surface 8 of the semiconductor chip 3 and the front surface 9 of the metal body 2, which are being in a condition detached from each other, it was found out that the glass material were attached over the both of the two surfaces. This means that the glass material was destroyed in the layer.

That is, the glass material to which no filler was added has good meltability and is capable of temporarily attaching to the front surface 9 of the metal body 2 and the rear surface 8 of the semiconductor chip 3. However, the thermal expansion coefficient of the glass material is large, and this would be the reason the glass layer was destroyed after bonding and the semiconductor chip 3 was detached.

In the case of the glass material to which a large amount of the filler was added, the semiconductor chip 3 also detached from and was unable to be bonded to the metal body 2. When we examined the rear surface 8 of the semiconductor chip 3 and the front surface of the metal body 2, which are being in a condition detached from each other, in the case of the glass material to which a large amount of the filler was added, it was found out that the rear surface 8 of the semiconductor chip 3 was not bonded at all with the glass material, resulting in a small bonding surface. That is, the bondability of the glass material with respect to the rear surface 8 of the semiconductor chip 3 is low, and bonding is less likely to occur, in other words, having poor wettability.

Figure 2:
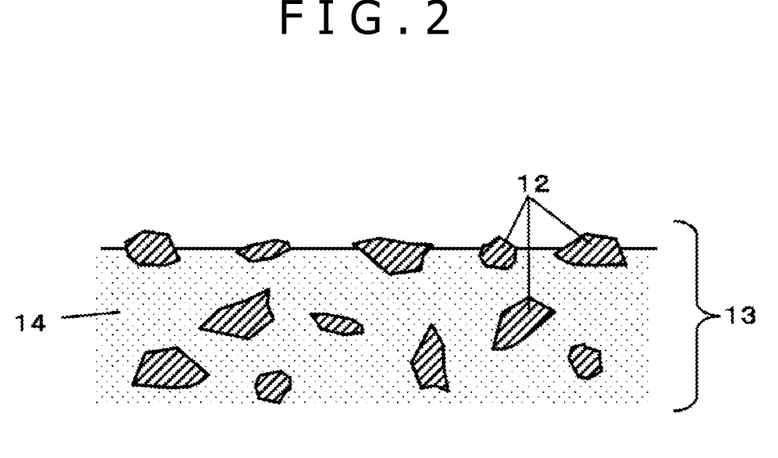
FIG. 2 is a schematic cross section of a filler-mixed glass material, as viewed through a scanning electron microscope (SEM).

To examine the reason the wettability of a glass material 13 with respect to the semiconductor chip 3 is reduced, we observed a surface of the glass material 13 to which a filler 12 is added using an SEM. FIG. 2 is a schematic cross section of the glass material 13 to which the filler is mixed, as viewed through the SEM. As illustrated in FIG. 2, the filler 12 protrudes from the surface of a glass component 14, forming surface irregularities. One of the reasons for the formation of the surface irregularities by the filler 12 would be that the filler 12 is generally lower in specific weight than the glass component 14. Another reason is that the melting point of the filler 12 is higher than that of the glass component 14. Thus, even after the glass component 14 has been softened and melted, the filler 12 remains solid, which makes it protrude easily from the surface.

When the filler 12 protrudes from the surface of the glass component 14 by the glass material 13 being heated to be softened and melted, the fluidity of the glass material 13 is decreased. Also, the protrusion of the filler 12 from the surface of the glass component 14 results in formation of surface irregularities on the surface of the glass material 13. With these, the bondability of the glass material 13 with respect to the semiconductor chip 3 is blocked. To offset the decrease in fluidity, the heating temperature may be increased, but as described above, the heatproof temperature of the semiconductor chip 3 needs to be taken into account.

Formation of voids due to foaming of some components in the glass component 14 also needs to be considered.

Another possible method is to allow the glass layer to have continuously different thermal expansion coefficients between the semiconductor chip 3 and the metal body 2, as in Patent Document 1. In Patent Document 1, the thermal expansion coefficient of the glass layer is made almost equal to that of the semiconductor chip 3 at the section of the glass layer that is in contact with the rear surface 8 of the semiconductor chip 3. To achieve this, it is necessary to increase the amount of the filler 12 contained in the glass component 14 near the rear surface 8 of the semiconductor chip 3. Increasing the amount of the filler 12 in the glass component 14 reduces the thermal expansion coefficient of the entire glass material 13. However, as described above, the meltability of the glass material 13 is also reduced, making it difficult to ensure good bondability of the glass material 13 with respect to the semiconductor chip 3. Further, fabricating variations may lead to increases in bonding failure.

Therefore, we adopted the structure of FIG. 1. As stated earlier, the thermal expansion coefficients of the respective components of the semiconductor device 1 are such that the metal body 2>the second layer 6>the first layer 5>the semiconductor chip 3.

In the semiconductor device 1, the first layer 5 of the bonding layer 4 has a larger amount of the filler 12 and a lower thermal expansion coefficient. Formed on this first layer 5 is the second layer 6 with a slightly higher thermal expansion coefficient, meaning that it has a smaller amount of the filler 12 but has good meltability. The second layer 6 is formed thinner than the first layer 5.

The first layer 5 of the bonding layer 4 is deposited on the metal body 2 and calcined before the semiconductor chip 3 is mounted. Thus, the heat-resisting properties of the semiconductor chip 3 do not need to be considered, and materials with a wide range of calcination temperatures can be used for the material of the first layer 5. Further, the amount of the filler 12 can be increased without any major problems.

The second layer 6 of the bonding layer 4 has a higher thermal expansion coefficient or a smaller amount of the filler 12. Thus, the second layer 6 has good meltability and bondability with respect to the semiconductor chip 3. Since the first layer 5 has a larger amount of the filler 12, surface irregularities are formed on its top surface. The second layer 6, on the other hand, has a smaller amount of the filler 12 and better meltability and thus covers, such as to fill up, the surface irregularities on the top surface of the first layer 5. Since the second layer 6 has a larger thermal expansion coefficient, it is necessary to pay attention to the detachment and destruction of the second layer 6 that might occur due to the difference in thermal expansion coefficient after curing. To prevent those, by reducing the thickness of the second layer 6, the thermal expansion coefficient of the first layer 5 can be a dominant determiner of the thermal expansion coefficient of the entire bonding layer 4.

The following are specific examples of the amount of the filler 12 and the thicknesses of the first layer 5 and the second layer 6. The examples are not to limit the invention but are intended for reference purposes only.

The amount of the filler 12 added to the first layer 5 of the bonding layer 4 may be about 15 to 30 vol %.

The amount of the filler 12 added to the second layer 6 of the bonding layer 4 may be about 0 to 10 vol %.

The thickness of the entire bonding layer 4 may be about 200 µm or less.

The thickness of the second layer 6 is preferably half as large as that of the first layer 5 or less. The thickness of the second layer 6 is, for example, 5 to 20 µm. In that case, the thickness of the entire bonding layer 4 is approximately 20 to 80 µm.

Referring next to FIGS. 3(a) to 3(d), the method of fabricating the semiconductor device of FIG. 1 is described.

Figure 3:
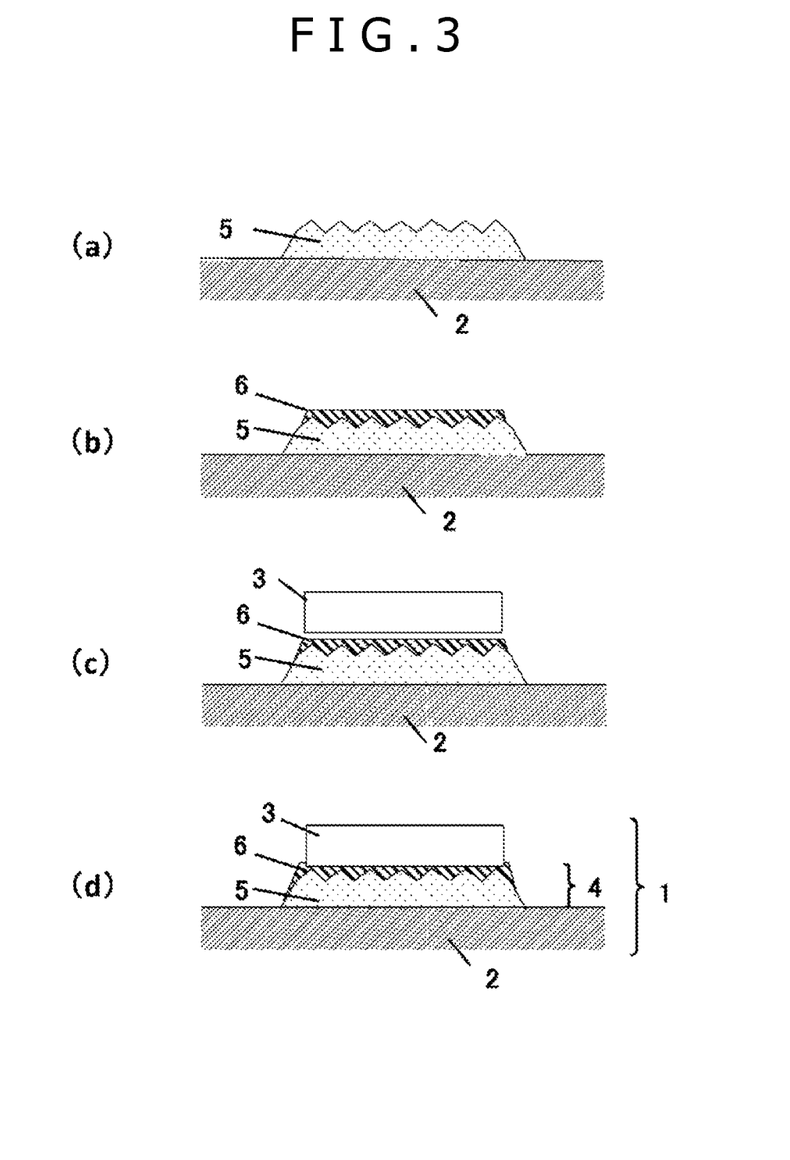

The first layer 5 is first formed on the metal body 2. The first layer 5 is a slurry paste obtained in advance by mixing the glass component 14, the filler 12 for thermal expansion coefficient adjustment, and organic components such as a solvent and synthetic resin. The paste is supplied to a predetermined position by screen printing or the like such that a predetermined area, thickness, and supply amount are achieved. Thereafter, the paste is heated at a high temperature for calcination. FIG. 3(a) illustrates the first layer 5 obtained after the calcination. The figure schematically illustrates the surface irregularities formed on the top surface by the filler 12 protruding therefrom. The heating process consists of a drying step for removing the solvent, a debinding step for leaving the paste untreated at a high temperature to remove the binder resin, and a calcination step for melting and integrating the glass component.

As illustrated in FIG. 3(b), the second layer 6 is formed on the first layer 5. Similar to the first layer 5, the second layer 6 is a slurry paste obtained in advance by mixing the glass component 14, the filler 12 for thermal expansion coefficient adjustment, and organic components such as a solvent and synthetic resin. The paste of the second layer 6 is supplied to a predetermined position on the first layer 5 by screen printing or the like such that a predetermined area, thickness, and supply amount are achieved. Thereafter, the paste is heated at a high temperature for calcination. Similar to the first layer 5, the heating process consists of a drying step for removing the solvent, a debinding step for leaving the paste untreated at a high temperature to remove the binder resin, and a calcination step for melting and integrating the glass component 14. In forming the second layer 6, the calcination step can be skipped.

As illustrated in FIG. 3(c), the semiconductor chip 3 is then mounted on the second layer 6. Thereafter, as illustrated in FIG. 3(d), the second layer 6 is heated and melted to bind the semiconductor chip 3 thereto. If the calcination step for the second layer 6 is skipped in the step of FIG. 3(b), the second layer 6 is calcined in the step of FIG. 3(d). Also, in that case, only the calcination step is performed to heat the glass component 14 up to a temperature that allows it to be softened and calcined, since the drying step and the debinding step have already been performed in the step of FIG. 3(b). In the step of FIG. 3(d), a weight can be placed on the semiconductor chip 3 to achieve good bonding, or spacers with a given thickness can be used to achieve a uniform thickness. The above steps result in the formation of the semiconductor device 1 of FIG. 1.

In the above embodiment, we have described the method in which a glass paste obtained by mixing a solvent and binder resin is used as the glass material 13 and supplied by printing. The invention, however, is not limited thereto but allows the use of compacted glass powders or glass pellets obtained by heating such powders. The use of such glass pellets makes it possible to skip the drying and debinding steps, resulting in shortened fabricating time. Also, variations in the supply amount of material at the time of printing may be reduced.

The rear surface 8 of the semiconductor chip 3 may remain being an Si chip. However, to enhance its bondability with respect to the glass material 13, a metalized layer of, for example, Cr, W, Ti, Ni, Pt, Pd, Au, Al, or Cu can be formed. Alternatively, it is also possible to form laminated metalized layers using some of such substances or to form, by deposition or sputtering, a metalized layer of alloy such as AlCu, for example. The use of a metalized layer of soft Al or the like can improve the resistance to chip breakage.

Embodiment 1 of the invention has the following advantageous effects.

(1) In the semiconductor device 1 formed by bonding the metal body 2 and the semiconductor chip 3 with the bonding layer 4, the bonding layer 4 includes the first layer 5 bonded to the metal body 2 and the second layer 6 bonded to the semiconductor chip 3. The first layer 5 includes the filler 12, and the thermal expansion coefficient of the second layer 6 is larger than that of the first layer 5. Since the first layer 5 includes a larger amount of the filler 12, surface irregularities are formed on its top surface. In contrast, the second layer 6 has a smaller amount of the filler 12 and thus good meltability. Therefore, the bondability of the bonding layer 4 with respect to the semiconductor chip 3 is high.

(2) The first layer 5 of the bonding layer 4 is deposited on the metal body 2 and calcined before mounting the semiconductor chip 3. Thus, the heat-resisting properties of the semiconductor chip 3 do not need to be considered, and materials with a wide range of calcination temperatures can be used for the material of the first layer 5.

(3) Since the second layer 6 has a larger thermal expansion coefficient, it may be detached or destroyed due to the difference in thermal expansion coefficient after cured. However, by making the thickness of the second layer 6 half as large as that of the first layer 5 or less, the thermal expansion coefficient of the first layer 5 can be a dominant determiner of the thermal expansion coefficient of the entire bonding layer 4. By doing so, it is possible to reduce the thermal expansion coefficient of the entire bonding layer 4 and prevent the detachment or destruction due to the difference in thermal expansion coefficient.

(4) Since the first layer 5 includes a larger amount of the filler 12, surface irregularities are formed on its top surface. In contrast, the second layer 6 has a smaller amount of the filler 12, and the second layer 6 covers the surface irregularities on the top surface of the first layer 5. Thus, the bondability between the first layer 5 and the second layer 6 is satisfactory.

(5) The second layer 6 is formed of a material with a melting point lower than that of the first layer 5. Especially, a material with a melting point lower than the heatproof temperature of the semiconductor chip 3 is used. By doing so, it is possible to ensure the characteristics of the semiconductor chip 3 and perform highly reliable bonding.

The main component of the bonding layer 4 can also be ceramics instead of the glass component 14. The word "main component" as used herein refers to the substance whose volume or weight occupies more than half that of the entire bonding layer 4.

Embodiment 2

Figure 4:
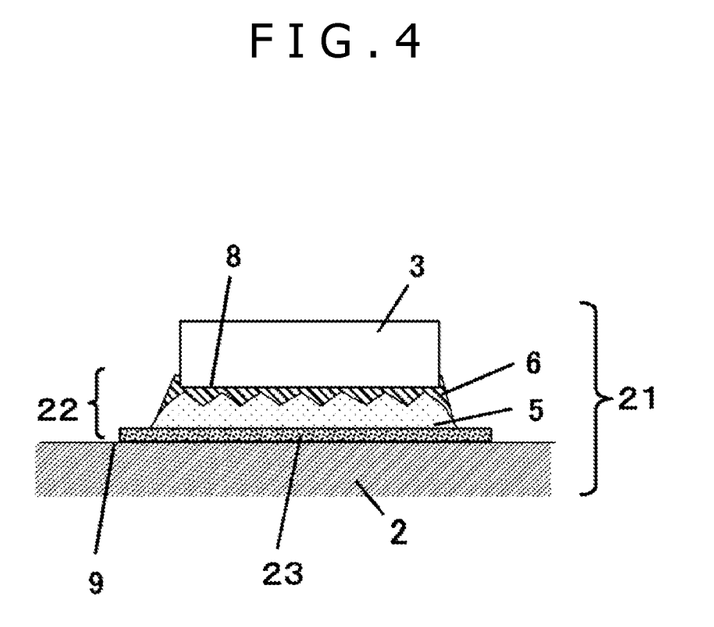
FIG. 4 is a cross section illustrating Embodiment 2 of the semiconductor device of the invention.

FIG. 4 is a cross section illustrating Embodiment 2 of the semiconductor device of the invention.

A semiconductor device 21 according to Embodiment 2 differs from the semiconductor device 1 of Embodiment 1 in that, in the former, an undercoat layer 23 is provided between the metal body 2 and the first layer 5.

In other words, a bonding layer 22 according to Embodiment 2 includes the first layer 5, the second layer 6, and the undercoat layer 23. The undercoat layer 23 is provided for the purpose of improving the bondability between the first layer 5 and the metal body 2. The undercoat layer 23 is formed of a material the thermal expansion coefficient of which lies between those of the first layer 5 and the metal body 2.

The thermal expansion coefficients of the respective components of the semiconductor device 1 are such that the metal body 2>the second layer 6>the first layer 5>the semiconductor chip 3. Besides, the thermal expansion coefficients of the respective components of the semiconductor device 1 are such that the metal body 2>the undercoat layer 23>the first layer 5. The thermal expansion coefficient of the second layer 6 can be higher or lower than that of the undercoat layer 23.

In Embodiment 2 as well, the second layer 6 needs to be thinner than the first layer 5. It is especially preferred that the thickness of the second layer 6 be half as large as that of the first layer 5 or less.

The undercoat layer 23 can be formed of the glass material 13 having a smaller amount of the filler 12 than in the case of the first layer 5.

The material of the undercoat layer 23 is not limited to glass. The undercoat layer 23 can instead be a metal layer with a low thermal expansion coefficient, such as a W or Mo layer, or formed of a ceramic. In the case of a ceramic, thermal spraying can be used to form it.

The undercoat layer 23, higher in thermal expansion coefficient than the first layer 5, is formed on the metal body 2 before the first layer 5 containing the filler 12 is formed on the metal body 2.

The semiconductor device 21 of Embodiment 2 also has the above advantageous effects (1) through (5), as is similar to the semiconductor device 1 of Embodiment 1. In addition, the bondability between the metal body 2 and the bonding layer 22 is enhanced further.

Bondability Evaluation

Figure 5:
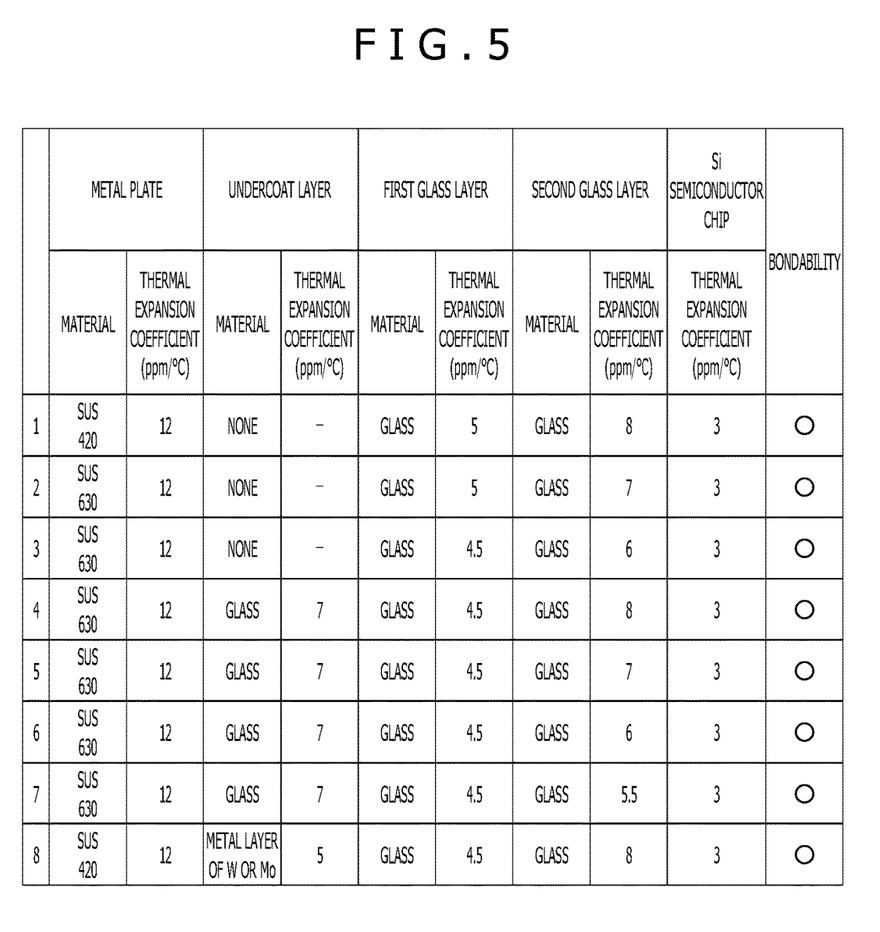
FIG. 5 shows the results of a bondability evaluation of semiconductor devices according to the invention and the relation among the materials of the respective layers forming the bonding layer, thermal expansion coefficients, and bondability.

FIG. 5 shows the results of an evaluation of the bondability of semiconductor devices according to the invention. Under the categories of the metal body 2, the undercoat layer 23, the first layer 5, the second layer 6, and the semiconductor chip 3, FIG. 5 shows the materials used, thermal expansion coefficients, and results of the bondability evaluation.

The undercoat layer 23 and the first layer 5 of FIG. 5 were calcined at a temperature higher than the heatproof temperature of the semiconductor chip 3 that is 450° C., while the second layer 6 was calcined at a temperature lower than the heatproof temperature of the semiconductor chip 3 that is 450° C. For example, in the case of the semiconductor device No. 5, the undercoat layer 23 was heated at 850° C. for 10 minutes while the first layer 5 was heated at 470° C. for 10 minutes. The bonding of the semiconductor chip 3 to the second layer 6 was performed at 400° C. for 10 minutes.

The semiconductor devices No. 1 to No. 8 were all good in terms of bondability.

Embodiment 1 of the Mechanical Quantity Measuring Device

We now describe an embodiment in which the semiconductor device 1 of the invention is incorporated into a mechanical quantity measuring device that measures mechanical quantities such as strain and pressure.

Figure 6:
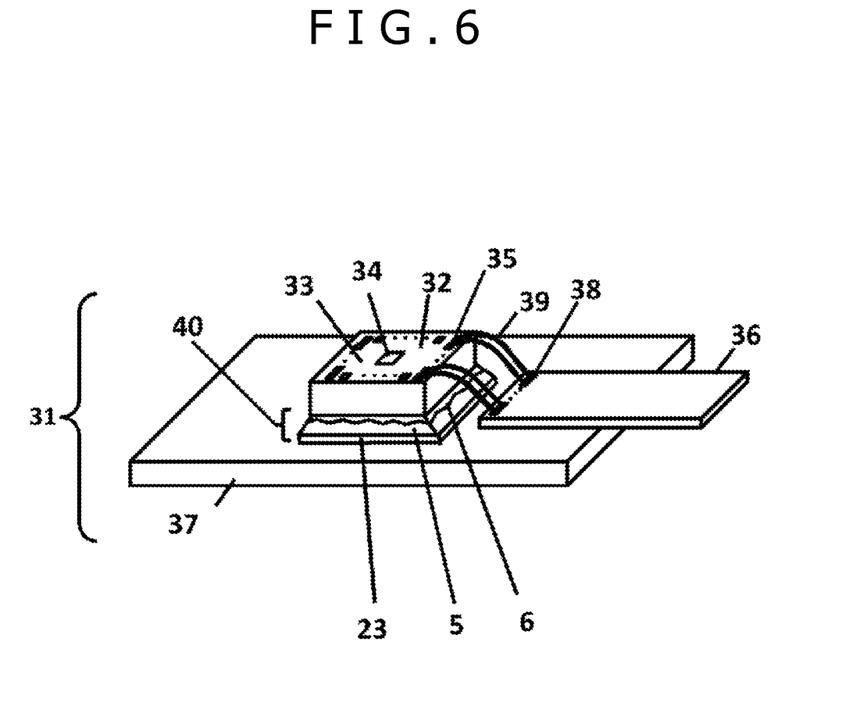
FIG. 6 is a perspective view illustrating Embodiment 1 of the mechanical quantity measuring device of the invention.

FIG. 6 is a perspective view illustrating Embodiment 1 of a mechanical quantity measuring device 31 according to the invention.

The mechanical quantity measuring device 31 includes a sensor chip 32, a bonding layer 40, a printed circuit board 36, and a metal body 37.

The sensor chip 32 is a semiconductor chip having a strain detector 34 that is a sensor element, near the center of a device surface 33. The sensor chip 32 is the semiconductor chip in the form of an about 1 to 10 mm square, 30 to 400 μm thick cuboid. The strain detector 34 detects strain changes resulting from changes in mechanical quantities such as strain or pressure. The strain detector 34 is, for example, a Wheatstone bridge circuit including a chip resistor (not illustrated) formed by doping a surface of a silicon substrate with impurity irons. The resistance of the impurity diffused resistor changes due to expansion and contraction generated in a plane direction of the sensor chip 32, whereby a strain is detected. If the sensor chip 32 includes a temperature sensor to correct temperatures measured, more accurate strain detection is possible.

An electrode 35, which is an output terminal of the sensor chip 32, is bonded to an electrode 38 of the printed circuit board 36 by a bonding wire 39 such an Au wire. The printed circuit board 36 is a flexible substrate such as one using a glass epoxy material or a polyimide material, or a hard substrate such as a ceramic substrate. The strain information detected by the strain detector 34 is transmitted to the printed circuit board 63 via the electrode 35, the bonding wire 39, and the electrode 38.

The metal body 37 acts as a strain-causing body. The metal body 37 can be formed of SUS, for example.

In the mechanical quantity measuring device 31, the bonding layer 40 that bonds the metal body 37 and the semiconductor chip 3 is structurally the same as the bonding layer 22 of Embodiment 2. That is, the bonding layer 40 includes the undercoat layer 23, the first layer 5, and the second layer 6. The thermal expansion coefficients of the respective components of the mechanical quantity measuring device 31 are such that the metal body 37>the second layer 6>the first layer 5>the semiconductor chip 32. Besides, the thermal expansion coefficients of the respective components of the mechanical quantity measuring device 31 are such that the metal body 37>the undercoat layer 23>the first layer 5. The thermal expansion coefficient of the second layer 6 can be higher or lower than that of the undercoat layer 23.

In Embodiment 2 as well, the second layer 6 needs to be thinner than the first layer 5. It is especially preferred that the thickness of the second layer 6 be half as large as that of the first layer 5 or less.

Figure 7:
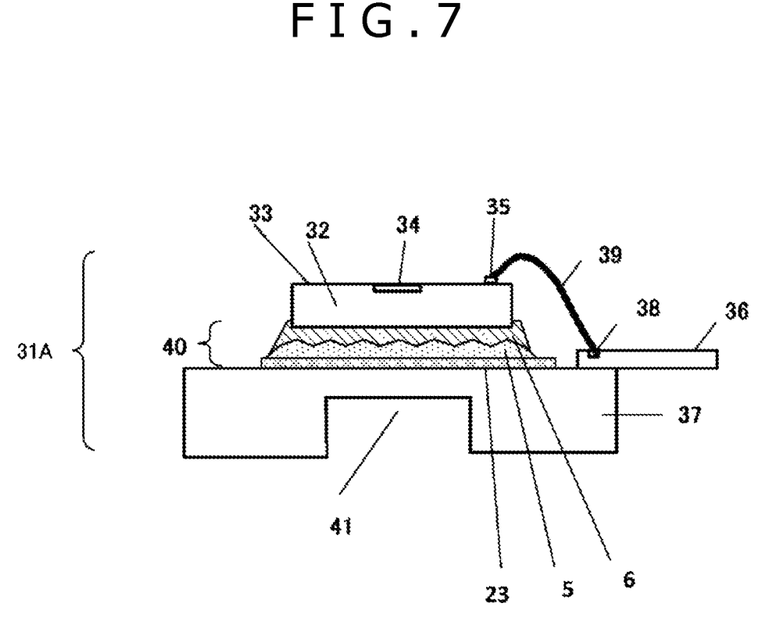
FIG. 7 is a cross section illustrating a modification of the mechanical quantity measuring device of FIG. 6.

FIG. 7 illustrates a modification of the mechanical quantity measuring device 31 of FIG. 6.

As illustrated in FIG. 7, in a mechanical quantity measuring device 31A according to a modification, the metal body 37, or a strain-causing body, takes the form of a diaphragm having at its center a concave section 41 that is rectangular in plane view. With the diaphragm shape, a larger amount of deformation can be obtained. Thus, it is effective when the sensor chip 32 may possibly be destroyed or when the amount of deformation is small and sufficient sensitivity cannot be ensured.

In the mechanical quantity measuring devices 31 and 31A of FIGS. 6 and 7, the metal body 37 and the sensor chip 32 are bonded together by the bonding layer 40, which is similar to that of the semiconductor device 1 of Embodiment 2. Thus, effects similar to those of the semiconductor device 1 of Embodiment 2 are provided.

In other words, the mechanical quantity measuring devices 31 and 31A are reliable in terms of the heat-resisting properties of the sensor chip 32. Also, the bondability between the metal body 37 and the bonding layer 40 and the bondability between the bonding layer 40 and the sensor chip 32 are high. Thus, it is possible to prevent creep or other deformations from occurring in the bonding layer 40 and detect strain accurately with the sensor chip 32.

Embodiment 2 of the Mechanical Quantity Measuring Device

Figure 8:
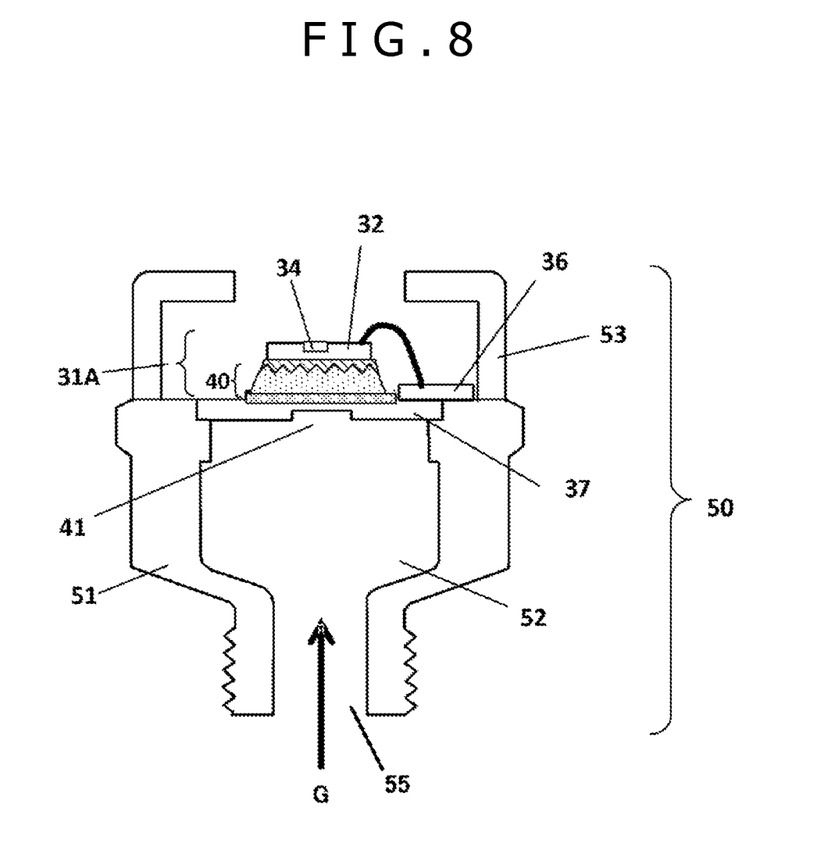
FIG. 8 is a cross section illustrating Embodiment 2 of the mechanical quantity measuring device of the invention.

FIG. 8 is a cross section illustrating Embodiment 2 of the mechanical quantity measuring device of the invention.

A mechanical quantity measuring device 50 according to Embodiment 2 includes a vessel 51, a casing 53, and the mechanical quantity measuring device 31A.

The mechanical quantity measuring device 50 is used to detect the pressure of gas G introduced into an internal space 52 of the vessel 51.

The mechanical quantity measuring device 31A of FIG. 7 is attached to the top of the vessel 51. As stated above, the mechanical quantity measuring device 31A has the structure in which the sensor chip 32 is fixed to the diaphragm-shaped metal body 37 via the bonding layer 40. The vessel 51 is substantially in the form of a hollow cylinder, having the internal space 52. At the bottom of the vessel 51 is a gas inlet 55 through which the gas G is introduced into the internal vessel 52. On the top side of the vessel 51 is the diaphragm-shaped metal body 37. The metal body 37 acts also as a lid of the vessel 51.

The metal body 37 is fixed to the vessel 51 through integral molding, metal bonding, or mechanical fastening using bolts, screws, or a crimping tool. In other words, the mechanical quantity measuring device 50 fixes the metal body 37 to the vessel 51 in a firmly fixing manner. Examples of metal bonding include laser welding, ultrasonic welding, friction stir welding, soldering, and brazing. To skip the process of bonding the metal body 37 to the vessel 51 or remove its influence on the sensor chip 32, the metal body 37 may preferably be formed integral with the vessel 51. To form the metal body 37 integral with the vessel 51, there are machining methods such as drawing or cutting.

The casing 53 is formed of a resin or metal material and protects the mechanical quantity measuring device 31A fixed to the vessel 51.

The mechanical quantity measuring device 50 is used as, for example, a pressure sensor for accurately controlling the supply amount of fuel. When the mechanical quantity measuring device 50 is used in a vehicle, for example, it is exposed to a high-temperature environment. Thus, it is necessary to prevent creep deformation occurring under a high-temperature environment from affecting the sensor characteristics.

The mechanical quantity measuring device 50 of the present embodiment includes the mechanical quantity measuring device 31A shown in FIGS. 6 and 7. Thus, as described above, it is possible to prevent creep or other deformations from occurring in the bonding layer 40 and detect strain accurately with the sensor chip 32.

While we have described various embodiments and modifications of the invention, the invention is not limited thereto. The invention embraces other possible embodiments that fall within the technical scope of the invention.

The present application claims the benefit of Japanese patent application No. 2015-135899, filed on Jul. 7, 2015 the content of which is incorporated herein by reference.

DESCRIPTION OF REFERENCE CHARACTERS

1: Semiconductor device
2: Metal body

3: Semiconductor chip
4: Bonding layer
5: First layer
6: Second layer
12: Filler
13: Glass material
14: Glass component
21: Semiconductor device
22: Bonding layer
23: Undercoat layer
31: Mechanical quantity measuring device
31A: Mechanical quantity measuring device
32: Sensor chip
34: Strain detector (sensor element)
37: Metal body
40: Bonding layer
50: Mechanical quantity measuring device

The invention claimed is:

1. A semiconductor device comprising:
a metal body;
a bonding layer placed on the metal body; and
a semiconductor chip placed on the bonding layer,
wherein the bonding layer includes:
 a first layer that contains a filler and is formed between the metal body and the semiconductor chip, and
 a second layer bonded to the first layer and the semiconductor chip, wherein the second layer has a thermal expansion coefficient higher than that of the first layer and a thickness of the second layer is half as large as that of the first layer or less.

2. A semiconductor device comprising:
a metal body;
a bonding layer placed on the metal body; and
a semiconductor chip placed on the bonding layer,
wherein the bonding layer includes:
 a first layer that contains a filler and is formed between the metal body and the semiconductor chip, wherein a main component of the first layer is a material whose specific weight is larger than that of the filler, and
 a second layer bonded to the first layer and the semiconductor chip, wherein the second layer has a thermal expansion coefficient higher than that of the first layer.

3. A semiconductor device comprising:
a metal body;
a bonding layer placed on the metal body; and
a semiconductor chip placed on the bonding layer,
wherein the bonding layer includes:
 a first layer that contains a filler and is formed between the metal body and the semiconductor chip, wherein surface irregularities are formed on an interface side of the first layer due to protrusion of the filler therefrom, and
 a second layer bonded to the interface side of the first layer and the semiconductor chip, wherein the second layer has a thermal expansion coefficient higher than that of the first layer, and the second layer covers the surface irregularities on the first layer.

4. The semiconductor device according to claim 1, wherein
a main component of each of the first layer and the second layer is glass.

5. The semiconductor device according to claim 4, wherein
the main component of the second layer is glass with a melting temperature lower than that of the main component of the first layer.

6. The semiconductor device according to claim 1, wherein
the bonding layer further includes a third layer between the first layer and the metal body, the third layer having a thermal expansion coefficient higher than that of the first layer.

7. The semiconductor device according to claim 1, wherein
the semiconductor chip includes a sensor element.

8. A mechanical quantity measuring device comprising the semiconductor device of claim 1, wherein the semiconductor chip includes a strain detector.

9. The semiconductor device according to claim 2, wherein
a main component of each of the first layer and the second layer is glass.

10. The semiconductor device according to claim 9, wherein
the main component of the second layer is glass with a melting temperature lower than that of the main component of the first layer.

11. The semiconductor device according to claim 2, wherein
the bonding layer further includes a third layer between the first layer and the metal body, the third layer having a thermal expansion coefficient higher than that of the first layer.

12. The semiconductor device according to claim 2, wherein
the semiconductor chip includes a sensor element.

13. A mechanical quantity measuring device comprising the semiconductor device of claim 2, wherein the semiconductor chip includes a strain detector.

14. The semiconductor device according to claim 3, wherein
a main component of each of the first layer and the second layer is glass.

15. The semiconductor device according to claim 14, wherein
the main component of the second layer is glass with a melting temperature lower than that of the main component of the first layer.

16. The semiconductor device according to claim 3, wherein
the bonding layer further includes a third layer between the first layer and the metal body, the third layer having a thermal expansion coefficient higher than that of the first layer.

17. The semiconductor device according to claim 3, wherein
the semiconductor chip includes a sensor element.

18. A mechanical quantity measuring device comprising the semiconductor device of claim 3, wherein the semiconductor chip includes a strain detector.

* * * * *